United States Patent [19]
Richard et al.

[11] Patent Number: 5,990,681
[45] Date of Patent: Nov. 23, 1999

[54] LOW-COST, SNAP-IN WHOLE-BODY RF COIL WITH MECHANICALLY SWITCHABLE RESONANT FREQUENCIES

[75] Inventors: Mark A. Richard, S. Euclid; Nicholas J. Mastandrea, Euclid, both of Ohio

[73] Assignee: Picker International, Inc., Highland Heights, Ohio

[21] Appl. No.: 08/950,946

[22] Filed: Oct. 15, 1997

[51] Int. Cl.$^6$ ........................................................... G01V 3/00
[52] U.S. Cl. .......................... 324/318; 324/320; 324/319; 600/422
[58] Field of Search ..................................... 324/318, 319, 324/322, 320; 600/422

[56] References Cited

U.S. PATENT DOCUMENTS

| | | | |
|---|---|---|---|
| 4,692,705 | 9/1987 | Hayes et al. | 324/318 |
| 4,740,751 | 4/1988 | Misic et al. | 324/307 |
| 4,920,318 | 4/1990 | Misic et al. | 324/311 |
| 5,212,450 | 5/1993 | Murphy-Boesch et al. | 324/318 |
| 5,406,204 | 4/1995 | Morich et al. | 324/318 |
| 5,457,387 | 10/1995 | Patrick et al. | 324/318 |
| 5,510,714 | 4/1996 | Takahashi et al. | 324/318 |

FOREIGN PATENT DOCUMENTS 8925919 of 0000 United Kingdom .

OTHER PUBLICATIONS

Joseph, Peter et al. "A Technique for Double Resonant Operation of Birdcage Imaging Coils," *IEEE Trans. Medical Imaging*, vol. 8, No. 3, Sep. 1989.

Lu, D. and P.M. Joseph. "A Technique of Double Resonant Operation of F–19 and H–1 Quadrature Birdcage Coils," *SMRM Book of Abstracts*, p. 531.

Schnall, M.D., et al. "A New Double–Tuned Probe for Concurrent $^1$H and $^{31}$P NMR," *Journal of Magnetic Resonance*, 65, 1985, pp. 122–129.

Joseph, P.M. et al. "A Double Resonant Birdcage Coil for Imaging of Flourine and Protons," 1988 *SMRM Book of Abstracts*, p. 263.

Rath, Alan R. "Design and Performance of a Double Tuned Birdcage Coil," *Journal of Magnetic Resonance*, 86, 1990, pp. 488–495.

"A Design for Double Tuned Birdcage Coil for Use in an Integrated MRI/MRS Examination," *Journal of Magnetic Resonance*, 89, 1990, pp. 41–50.

U.S. application No. 08/514,396, Srinivasan et al., filed Aug. 11, 1995.

*Primary Examiner*—Christine K. Oda
*Assistant Examiner*—Bry B. Shrivastav
*Attorney, Agent, or Firm*—Fay, Sharpe, Fagan, Minnich & McKee, LLP

[57] ABSTRACT

A snap-in, whole-body radio frequency coil (38) for increasing the diameter of a bore (12) of a toroidal magnetic resonance imaging apparatus includes a plurality of longitudinally extending coil elements (42) having element ends (44). The longitudinally extending coil elements are disposed on a flat, flexible, non-conductive plastic sheet (40) which is capable of being rolled and disposed concentricly in an interior diameter of the bore to form a thin-walled, bird-cage type radio frequency coil. Adjacent element ends are connected with a first capacitance $C_0$ to resonate the coil at a certain frequency. To permit mechanically switching the resonant frequency of the coil, protruding metal contacts (60) are electrically connected to the element ends. An adjustment end ring includes separated metal pads (66) disposed on a non-conducting ring substrate (64). Adjacent metal pads are connected with second capacitances $C_1$. The diameter of the adjustment end ring is preselected to permit resilient contact with the metal contacts. The adjustment end ring is rotatable to bring the metal pads and thus second capacitances $C_1$ in electrical contact with the element ends which increases the total capacitance between element ends and adjusts the RF coil to resonate at a lower frequency.

20 Claims, 9 Drawing Sheets

OTHER PUBLICATIONS

Yamai, S. et al. "A Dual–Port Double–Tuned Coil," 1990 *SMRM Book of Abstracts*, p. 530.

Murphy–Boesch, J. et al. "A Dual Tuned, Four–Ring Birdcage for Clinical $^1H^{31}P$ Spectroscopy of the Head at 4 Tesla," 1993 *SMRM Book of Abstracts*, p. 1331.

Shen, G.X. and Thulborn, K.R. "High Efficiency Double–Tuned RF Coil Using a Switching Technique," 1994 *SMR Bok of Abstracts*, p. 1124.

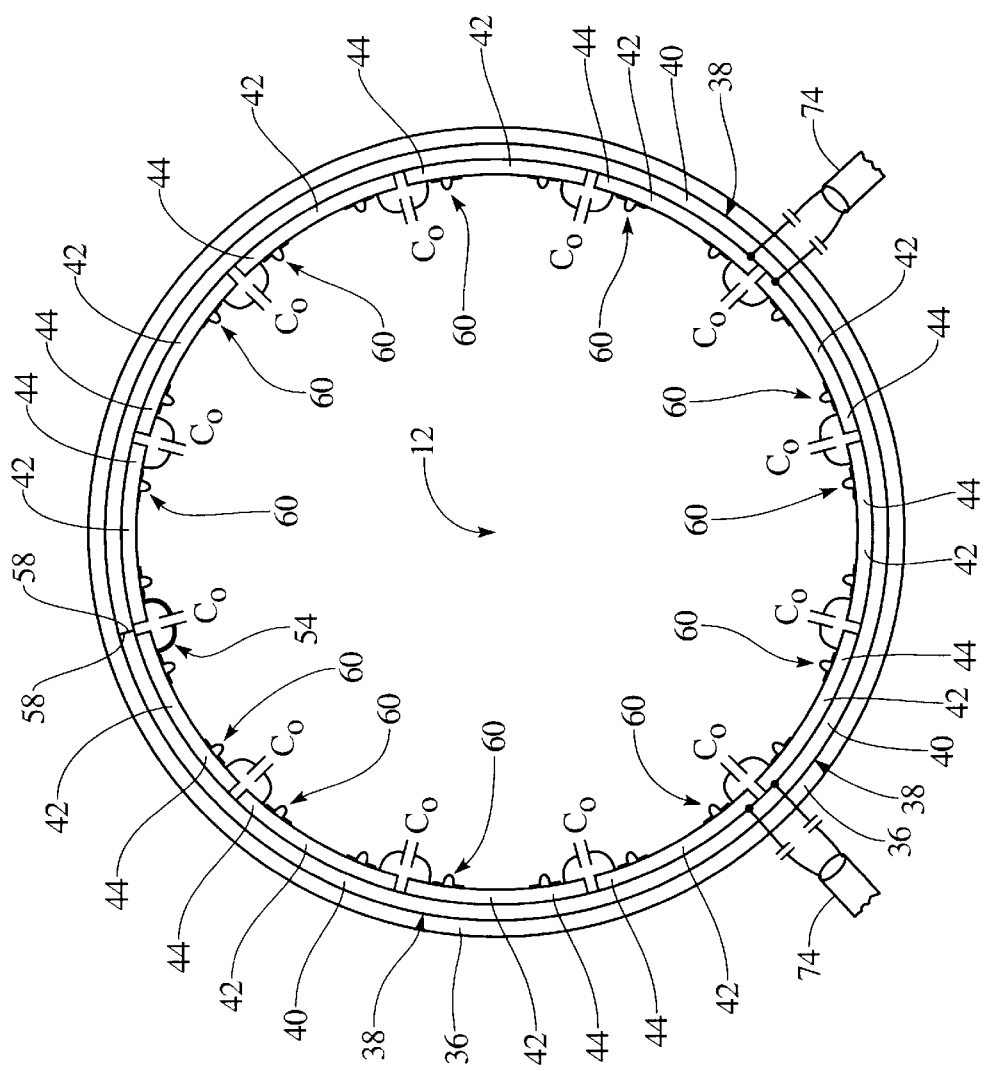

LOW-COST, SNAP-IN WHOLE-BODY RF COIL WITH MECHANICALLY SWITCHABLE RESONANT FREQUENCIES

BACKGROUND OF THE INVENTION

The present invention relates to the magnetic resonance arts. It finds particular application to human magnetic resonance imaging in which a radio frequency magnetic resonance imaging coil is tuned to the resonance frequencies of phosphorous and hydrogen (or other dipoles of interest) and will be described with particular reference thereto. The coil may be used in transmit and receive modes, in transmit only modes, in receive only modes and may be used in conjunction with local gradients for high resolution imaging as well as spectroscopy. It is to be appreciated, however, that the invention will also find application in animal studies, non-human studies, high resolution in-vitro cell culture and profusion studies, industrial applications, security inspections and the like, as well as in other types of magnetic resonance imaging systems, magnetic resonance spectroscopy systems, and the like.

In magnetic resonance imaging applications, radio-frequency (RF) coils are used both to transmit RF pulses into and receive induced nuclear magnetic resonance (NMR) signals from a bore of a magnetic resonance imager. Typically, magnetic resonance imagers also include a series of annular resistive or superconducting magnets. Vacuum dewars in superconducting magnets and housing structures of resistive magnets define a central, longitudinal bore within which the subject is received. Commonly, a series of gradient magnetic field coils are mounted to a cylindrical dielectric former(s) for mounting in the magnet bore, reducing the patient receiving diameter. A whole body RF coil is mounted on another dielectric former for mounting in the interior bore of the gradient coil dielectric former. The gradient and RF coils, RF shield, and the formers are potted into a unitary structure, further reducing the patient receiving diameter.

Maintaining a large bore or patient aperture is advantageous. A large patient receiving bore not only accommodates large patients and provides a less claustrophobic environment, but it also allows imaging of portions of the subject further from the center of the bore. For example, shoulder imaging requires the patient's shoulders to be displaced radially inward from the RF coil.

The diameter reductions in the bore become more critical when self-shielded gradient coils are used. With self-shielded gradient coils, there are two sets of gradient coils disposed in a spaced relationship. The pair of gradient coil sets produce magnetic fields which (1) sum within the bore to create the desired magnetic field gradients and (2) subtract outside the bore. The subtraction zeroes or minimizes the external field to inhibit magnetic field gradient pulses from inducing eddy currents in the main magnet and associated structures. To achieve this shielding effect efficiently, a significant minimum spacing between the primary and secondary gradient coils is required. Analogously, an RF shield is advantageously disposed between the RF coil and the gradient coils to prevent the RF pulses from inducing eddy currents in the gradient coils. Again, a significant, minimum spacing between the RF coils and the RF shield is required.

Typically, a whole-body RF coil consists of a copper pattern etched on a circuit board with an FR-4 dielectric or other dielectric form. One or more of these circuit boards are wrapped around and fastened to the outer diameter of a filament wound tube or other cylindrical or elliptical dielectric form. Electrical components, such as capacitors, inductors, and diodes are soldered on to the circuit board to resonate the coil at the desired frequency. The tube has a diameter of 55 to 60 cm or about 20 mm or more less than the interior diameter of the gradient coil in which it is inserted, depending on the size of the patient. A tube of 55 to 60 cm is large enough to allow patients of up to approximately 180 kg to fit inside. This tube is inserted inside the gradient coil assembly and within the RF shield of the coil assembly. Feet, skid bars, or other support structures are used to position the coil concentric with the gradient tube and, thus, the RF shield.

The use of the filament wound tube has significant disadvantages. Importantly, it decreases the amount of radial space available to the patient. Further, an appropriately constructed and machined tube adds significantly to the cost of the body coil. In addition, when a filament wound tube is used, the construction and assembly of additional parts, such as feet and skid bars, further increase the total cost. Further, when a filament wound tube is used with an integral RF shield, it is difficult to ensure concentricity of the RF coil with the RF shield. A departure from concentricity adversely affects the performance of the RF coil by decreasing the coil's quadrature isolation (and thus signal-to-noise ratio) and uniformity. This becomes even more critical when the RF coil is brought closer to the RF shield.

The frequency at which the coil needs to operate is dependent on the main magnet's field strength $B_0$ and the gyromagnetic ratio $\gamma$ of the dipole(s) of interest. In a 1.5 Tesla magnetic field, hydrogen dipoles $^1H$ have a resonance frequency of about 64 MHz. There are typically other dipoles in the examination region with markedly different resonance frequencies, e.g., phosphorous $^{31}P$ with a resonance frequency about 24 Mhz, or flourine $^{19}F$ with a resonance frequency of 60 MHz. The radio frequency coil is commonly tuned to the magnetic resonance frequency of the selected dipole of interest.

When performing magnetic resonance spectroscopy upon a subject, it is desirable to switch quickly between proton imaging and spectroscopy imaging. Coils which can operate at more than one resonant frequency have traditionally been of the following types: doubly-tuned; electrically-switched; and, inserted-sleeve.

A doubly-tuned RF coil is simultaneously resonant at two separate frequencies. The coil uses both a high pass and a low pass circuit. At the lower frequency, the low pass circuit resonates, while at the higher frequency, the high pass circuit resonates. Alternatively, doubly-tuned RF coils are constructed by placing a tank circuit in series with resonant capacitors. The extra capacitance is switched in at one frequency. At the second resonant frequency, the tank circuit blocks current from flowing in these extra capacitors. Although some nuclei, such as phosphorous, lend themselves well to doubly-tuned coils of either type, others, such as fluorine, do not. This is because the imaging frequency of fluorine is very close to the imaging frequency of hydrogen. With such close frequencies, i.e., separated by less than an octave, the coil has difficulty resonating separately at both frequencies. One of the two resonant frequencies operates in a non-optimum mode, thus sacrificing the performance of the coil at that frequency. In addition, it is difficult if not impossible to tune a birdcage coil to more than two separate frequencies.

Although other methods for double-tuning a birdcage coil have been described, such as Peter Joseph et al., "A Technique for Double Resonant Operation of Birdcage Imaging Coils," *IEEE Trans. Medical Imaging*, vol. 8, No. 3, September 1989, and U.S. Pat. No. 5,212,450 by Murphy-Boesch et al., each method has its distinct disadvantages. The method of Joseph introduces field inhomogeneities while the method of Murphy-Boesch et al. increases the complexity of the design and construction by requiring four rings. In general, doubly-tuned methods do not allow for quadrature imaging. An exception is the four ring design of Murphy-Boesch et al.

Electrically-switched RF coils employ PIN diodes to switch between two sets of capacitors in order to adjust the tuning. Such coils have the disadvantage of working only for receive coils and thus are not applicable for whole body coils. Further, the high voltage and currents generated during transmit pulses can short circuit the diodes and render the coil ineffective.

Inserted-sleeve coils use a dielectric tube inside the RF coil to create an additional separate resonance frequency. See U.K. Patent Application No. 89-25919.6 by Schnur. On its outer diameter, the dielectric tube has metallic strips which add capacitance in parallel to the existing coil capacitors. Another type of inserted-sleeve coil uses two separate RF shields. See D. Lu and P. M. Joseph, "A Technique of Double Resonant Operation of F-19 and H-1 Quadrature Birdcage Coils," 1990 *SMRM Book of Abstracts*, p. 531. The two shields have such diameter that each one causes the RF coil to resonate at the desired frequency. These RF coils have two disadvantages. First, it is difficult to insert a sleeve without repositioning the patient. Second and more importantly, these methods only work when the two desired resonances are very close in frequency. It should also be noted that RF coils using dielectric tubes inside the coils have been found to be inherently unstable over extended periods of time (i.e., the resonant frequency of the coil tends to vary with time and temperature).

The present invention contemplates a new and improved method and apparatus for positioning a whole-body RF coil and mechanically switching its resonant frequencies within a bore of an MRI apparatus which overcomes the above-mentioned problems and others.

SUMMARY OF THE INVENTION

In accordance with the present invention, a magnetic resonance apparatus comprises a toroidal magnet assembly for generating a temporally constant magnetic field through an examination region. The magnet assembly includes a generally cylindrical member which defines a longitudinally extending bore around the examination region. The apparatus further comprises a gradient coil assembly including a cylindrical dielectric former which supports a plurality of gradient coils mounted in the bore. Still further, the apparatus includes a radio frequency coil assembly which includes a plurality of longitudinally extending coil elements having element ends. The longitudinally extending coil elements are disposed on flexible, non-conductive plastic sheet. The plastic sheet is capable of being disposed in and remain concentric with an interior diameter of the bore.

Adjacent element ends are capacitively connected to one another to form a bird-cage type coil.

In accordance with a more limited aspect of the invention, the magnetic resonance apparatus further includes protruding metal contacts electrically connected to the element ends and a adjustment end ring for adjusting the resonant frequency of the radio frequency coil. The adjustment end ring is capable of being disposed over the metal contacts. The adjustment end ring has separated metal pads disposed on a non-conducting ring substrate. The diameter of the adjustment end ring is preselected to permit selective electrical coupling between the protruding metal contacts and the metal pads. The adjustment end ring is rotatable between an open position, in which the metal pads are not in electrical connection with the element ends, and a conductive position, in which the metal pads are in electrical communication with the element ends such that capacitance between element ends is increased.

In a still more limited aspect of the invention, capacitors are connected between adjacent metal pads of the adjustment end ring to increase the resultant capacitance between element ends in the conductive position.

In accordance with another aspect of the invention, a magnetic resonance apparatus comprises a magnetic assembly for generating a magnetic field through an examination region. A radio frequency coil assembly performs at least one of (1) selectively transmitting radio frequency signals into the examination region to induce and manipulate resonance of first, higher gyromagnetic ratio dipoles and second, lower gyromagnetic ratio dipoles disposed in the examination region, and (2) selectively receiving first resonance frequency signals from the first dipoles and second resonance frequency signals from the second dipoles. A processor processes the received magnetic resonance signals. The radio frequency coil includes a plurality of parallel coil elements which define a cylindrical region. The coil elements have ends on which are protruding metal contacts. An end ring provides capacitance $C_0$ between adjacent coil elements such that the radio frequency coil is capable of resonance at the frequency of first, higher gyromagnetic ratio dipoles. An adjustment end ring adjusts the resonant frequency of the radio frequency coil. The diameter of the adjustment end ring is preselected to permit resilient contact with the protruding metal contacts. The adjustment end ring has separated metal pads disposed on a non-conducting ring substrate. Pairs of separated metal pads are capacitively connected with capacitance $C_1$. The adjustment end ring is rotatable between a non-contact position, in which the metal pads are not in contact with the protruding metal contacts and a first contact position, in which the metal pads are in contact with the protruding metal contacts. This introduces capacitance $C_1$ between elements such that the radio frequency coil is resonant at the frequency of the second, lower gyromagnetic ratio dipoles.

In accordance with a more limited aspect of the invention, the coil elements are disposed on a flexible, non-conductive plastic sheet.

One advantage of the present invention is that it provides a more thinly walled yet concentric whole body RF coil which in turn permits a larger bore diameter. Such an RF coil accommodates large patients, reduces patient claustrophobia, and allows imaging of portions of the subject further from the center line of the bore.

Another advantage of the present invention is that it permits an RF coil to be easily switched among several different resonant frequencies without repositioning the subject or interchanging cumbersome whole-body RF coils. Further, the switching is done without any sacrifice in coil performance when compared to a single frequency, non-switchable birdcage coil.

Still another advantage of the present invention is decreased cost of a whole-body RF coil.

Yet another advantage of the present invention is that it simplifies serviceability. The RF coil is readily removed and replaced by the operator without a service call.

BRIEF DESCRIPTION OF THE DRAWINGS

Still further advantages of the present invention will become apparent to those of ordinary skill in the art upon reading and understanding the following detailed description of the preferred embodiments.

The invention may take form in various components and arrangements of components and in various steps and arrangement of steps. The drawings are only for purposes of illustrating a preferred embodiment and are not to be construed as limiting the invention.

FIG. 3 is an end view of the radio frequency coil assembly of FIG. 2 inserted into a bore;

FIG. 4 is an enlarged, perspective view of a spring metal contact of the radio frequency coil assembly of FIGS. 2 and 3;

DETAILED DESCRIPTION OF THE PREFERRED EMBODIMENTS

Figure 1:
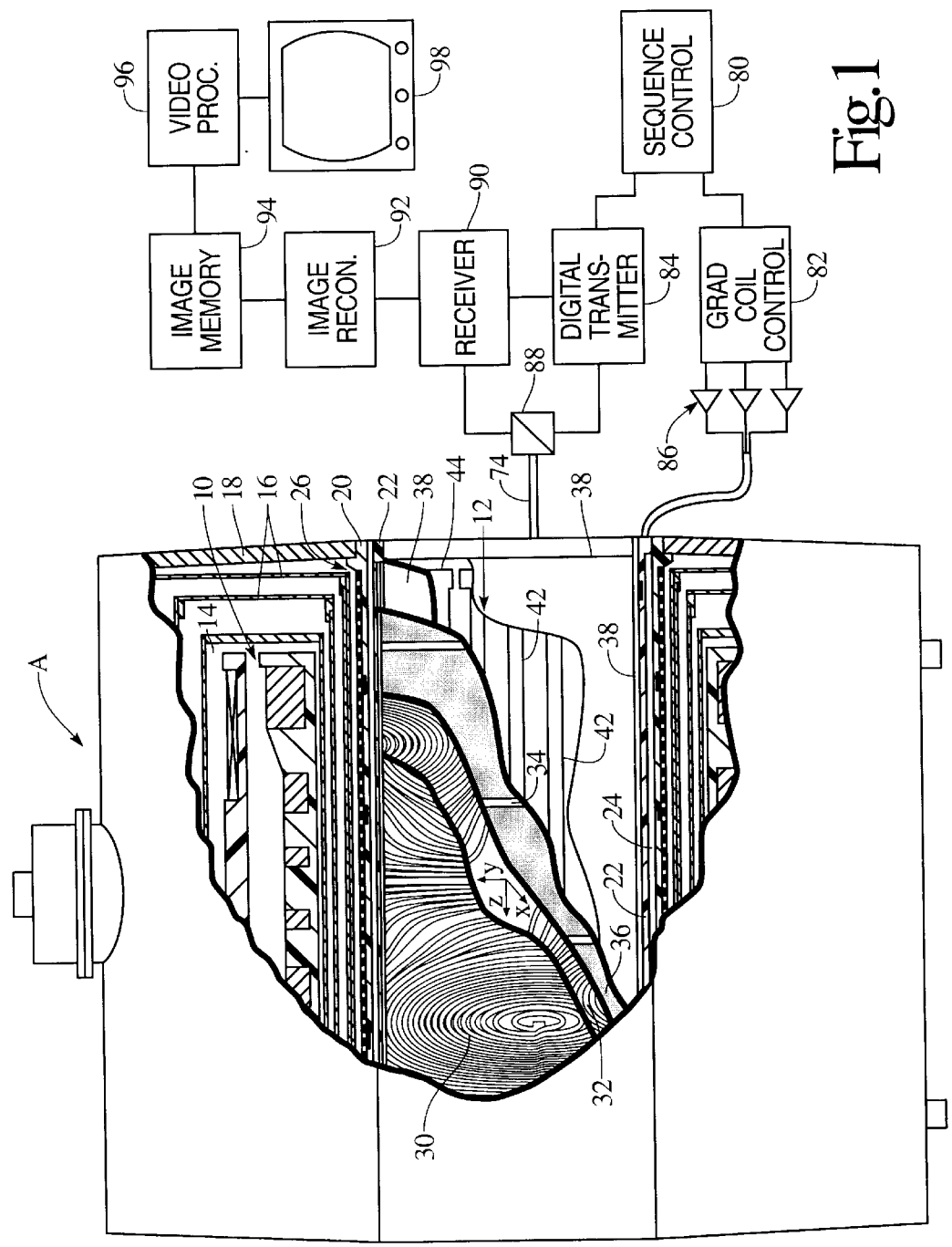
FIG. 1 is a super conducting magnetic resonance imaging (MRI) system in partial cross-sectional which incorporates the features in accordance with the present invention.

With reference to FIG. 1, an MRI apparatus A includes a self-shielded superconducting magnetic field coil assembly 10 having a pair of interacting superconducting coils. The coils interact to generate a temporally constant substantially uniform magnetic field axially along a longitudinal or z-axis of a central bore 12. The magnetic fields also interact such that they substantially cancel in regions outside of the bore. The self-shielded main magnet field coil assembly 10 is supported in a liquid helium vessel or can 14 which maintains the superconducting magnet coils cold enough to be superconducting with the impressed magnetic fields. To reduce helium boil-off, a series of progressively warmer cold shields 16 surround the helium can 14. A toroidal vacuum vessel or dewar 18 encases the cold shields to define a vacuum reservoir.

The vacuum vessel or dewar 18 includes a cylindrical tubular member 20 which defines its inner bore. A cylindrical gradient coil assembly 22 is inserted into the vacuum vessel bore 20, leaving an annular gap 24 therebetween. The annular gap, preferably, holds trays or racks for holding thin, ferrous magnetic shield members for shimming the main magnetic field. The primary gradient coil assembly 22 is displaced from a secondary or shield gradient coil assembly 26. The primary and secondary or shield gradient coil assemblies 22, 26 work together to generate gradient magnetic fields which superimpose in the bore 12 to generate magnetic field gradients of a selected profile. The primary and secondary gradient magnetic field assemblies are configured such that their magnetic fields cancel in regions around the secondary gradient magnetic field assembly such that the gradient magnetic field pulses do not induce currents in the cold shield 16, the helium can 14, or other adjacent electrical conductors.

More specifically to the preferred embodiment, the primary gradient coil assembly 22 includes four fingerprint type gradient coils 30 for generating magnetic fields in an x or horizontal direction. Analogously, a second set of fingerprint gradient coils 32 are mounted 90° rotated relative to the x-gradient coils for generating gradient magnetic fields in a y or vertical direction. A series of annular z-gradient coils 34 extend circumferentially around the bore 12. A radio frequency shield 36, such as lapped sections of copper sheet or mesh, extends around an inner diameter of the gradient coils for shielding the gradient coils from radio frequency energy. A snap-in whole-body RF coil assembly 38 also extends around the inner diameter of the radio frequency shield 36. The x-gradient coils 30, the y-gradient coils 32, the z-gradient coils 34, the RF shield 36, and RF coil assembly 38 are electrically insulated from each other. For convenience of manufacture, the gradient coils and the RF shield are preferably layered on a fiber reinforced plastic cylindrical former and the entire assembly encased in epoxy potting to form a strong, rigid assembly.

Figure 2:
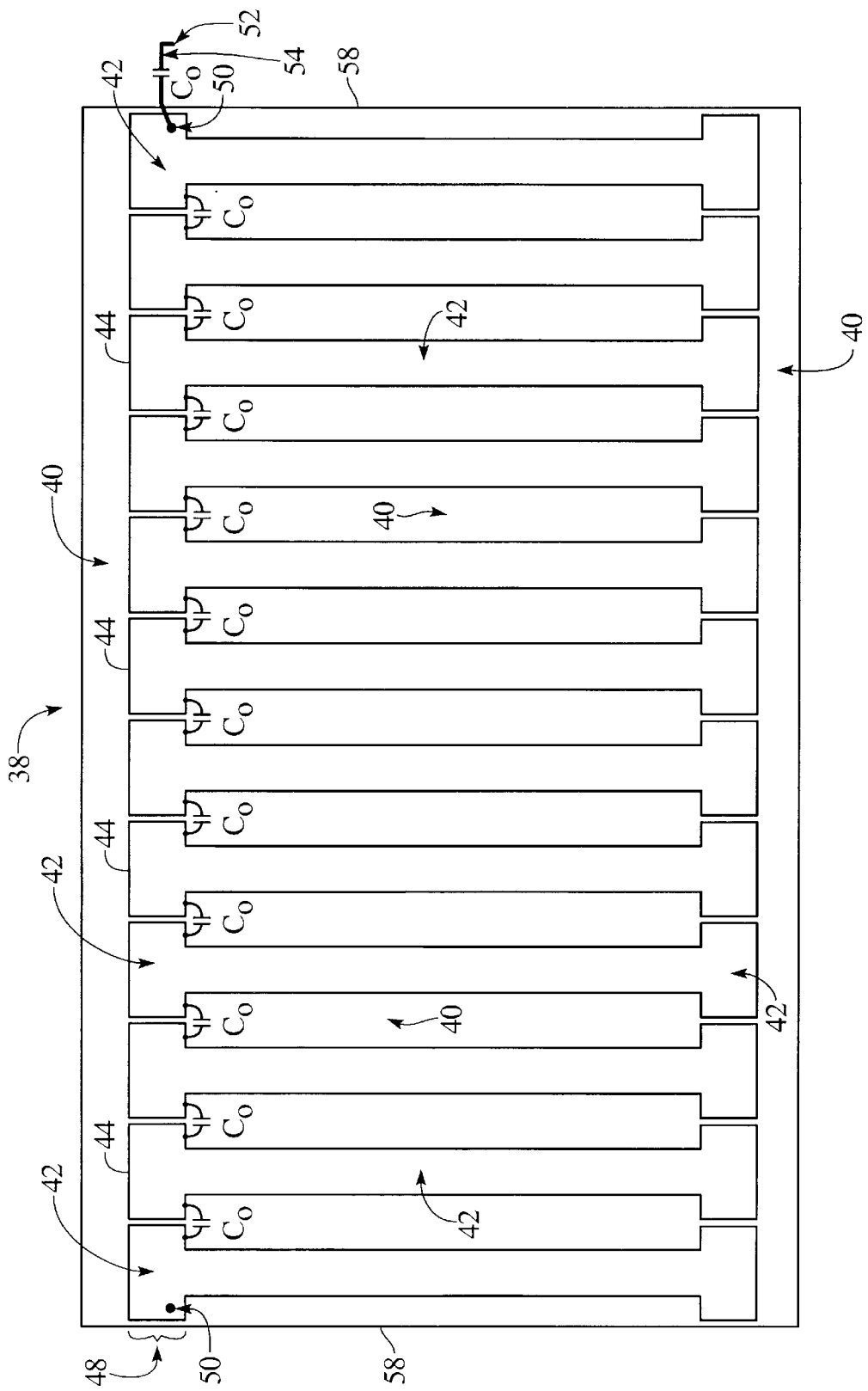
FIG. 2 is a view of the laid-out radio frequency coil assembly in accordance with the present invention.

With reference to FIG. 2, the RF coil assembly 38 includes a birdcage-type coil that is etched on a thin (e.g. 0.75 mm), flat, flexible, copper-clad plastic sheet 40, such as FR-4 fiber glass reinforced resin sheets. Of course other electrically conductive cladding, such as silver, and non-conductive sheet may be used. The RF coil is etched to remove the copper cladding such that a plurality of equally-spaced, longitudinally extending I-shaped conductor elements 42 having ends 44 remain. Although twelve longitudinal elements are illustrated, it is to be appreciated that the number may be more or less. Preferably, the coil contains a multiple of four (i.e., 4, 8, 12, etc.) elements so that quadrature operation may be obtained. The RF coil may be either of a high pass or low pass design.

With continuing reference to FIG. 2 and further reference to FIG. 3, the FR-4 sheet is cut to a length equal to the circumference of the inner diameter of the RF shield 36. The size and spacing of the I-shaped members is selected such that the selected number fills the cut size of the sheet. Capacitors $C_0$ bridge adjacent ends 44 of the conductor elements to form an end ring 48 which reveals itself when the coil is fully assembled. Additional electrical components (not shown), such as PIN diodes, and cables or connectors, are soldered to the RF coil assembly as necessary. Receptacles 50 on ends of outermost conductor elements receive electrical jumper pins 52 of jumper cable 54 when the coil is fully assembled. The jumper cable also has capacitance $C_0$ to maintain equal capacitance between conductor elements. The coil assembly 38 is then inserted into the gradient coil and snapped into position so that ends 58 of the FR-4 sheet butt together. Jumper pins 52 are then inserted into receptacles 50 to form the complete end ring 48.

Alternately, other components such as copper straps are electrically connected across the butted ends of the sheet to complete the electrical connection. However, this negatively impacts serviceability. In another embodiment, the copper-clad plastic sheet consists of two or more separate pieces which are electrically or capacitively connected by one of the methods described above. The elements are disposed on the two or more plastic sheets. The sheets are placed side to side and rolled so that ends of the sheets abut to form a cylinder.

With continuing reference to FIG. 3 and further reference to FIG. 4, spring metal contacts 60, preferably of phosphor-bronze, are disposed adjacent the capacitors 46 on ends 44 of the conductor elements on the interior diameter of the coil assembly. The metal contacts are shaped and attached so as to protrude from the inner surface of the coil.

Figure 5:
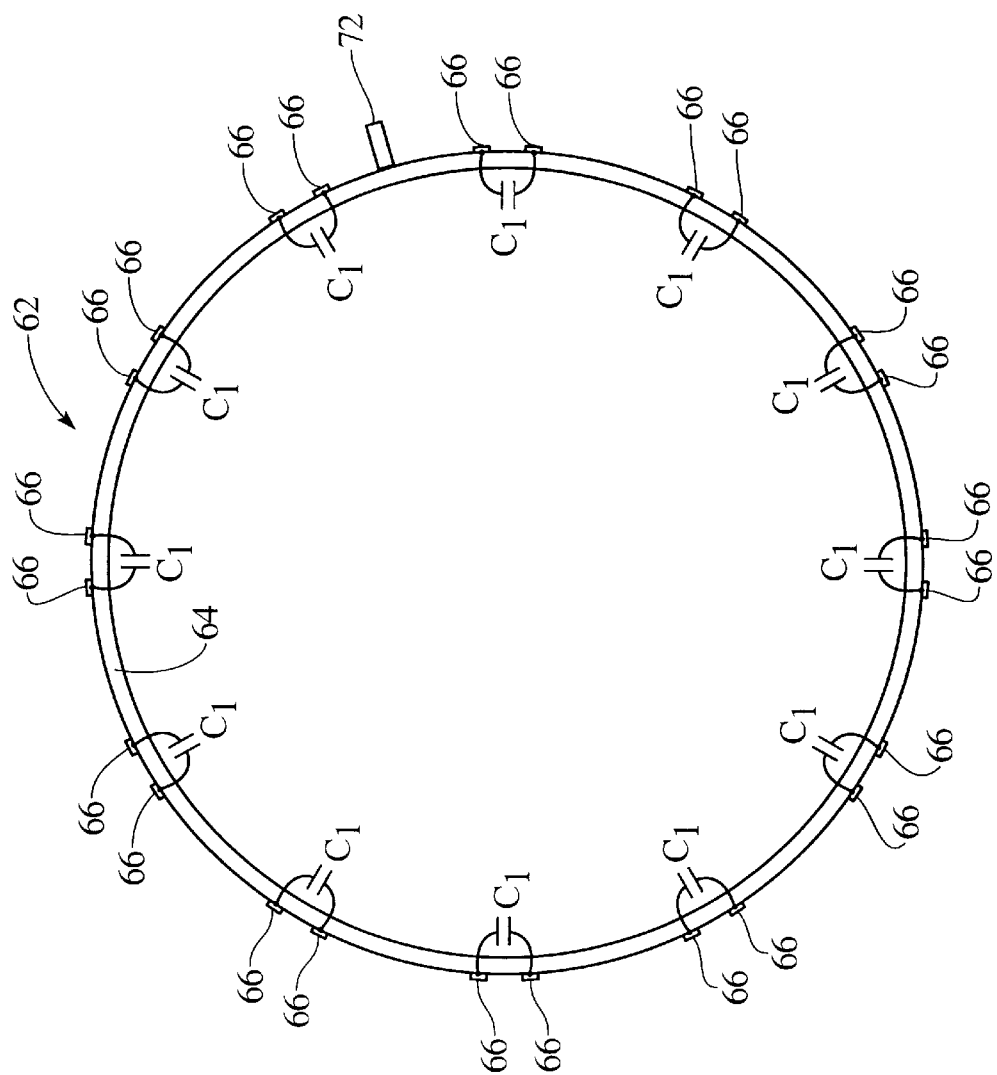
FIG. 5 is an end view illustrating an adjustment end ring for use with the radio frequency coil of FIG. 3.

With reference to FIG. 5 and continuing reference to FIG. 3, an adjustment end ring 62 consisting of non-conductive material 64, such as FR-4, is then inserted into the interior diameter of the snap-in whole body coil so that it contacts protruding metal contacts 60. Alternately, the spring metal contacts may be replaced by metallic posts or other protruding contacts as long as they are capable of contacting the adjustment end ring. As yet another alternative, the rings can be inductively or capactively coupled. On an exterior diameter of the adjustment end ring are pairs of metallic pads 66 connected by capacitors $C_1$.

Figure 6A:
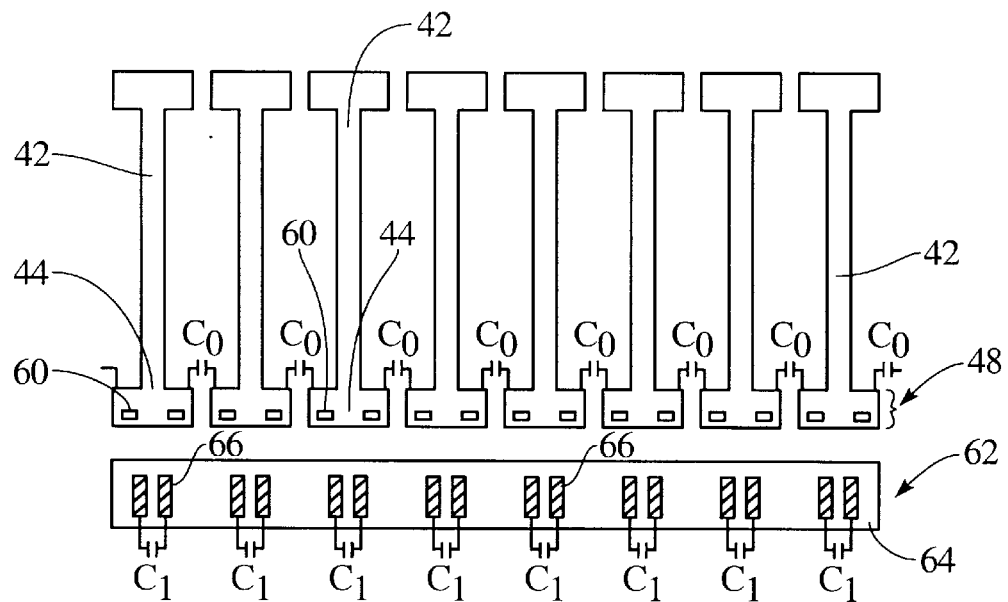
FIG. 6A is a partial view of the laid-out radio frequency coil of FIG. 3 including the adjustment end ring of FIG. 5 in a non-contact position for resonance at a higher frequency.

With continuing reference to FIG. 5 and FIG. 3, and further reference to FIG. 6A, in a non-contacting position, the metallic pads 66 do not contact the spring metal contacts 60 of the coil. Alternately, pairs of pads 66 connected with a common capacitor $C_1$ can connect with spring contacts 60 of a common end 44 of the elements. In this non-contacting position, the resonant frequency of the coil is determined solely by capacitors $C_0$ on the coil.

Figure 6B:
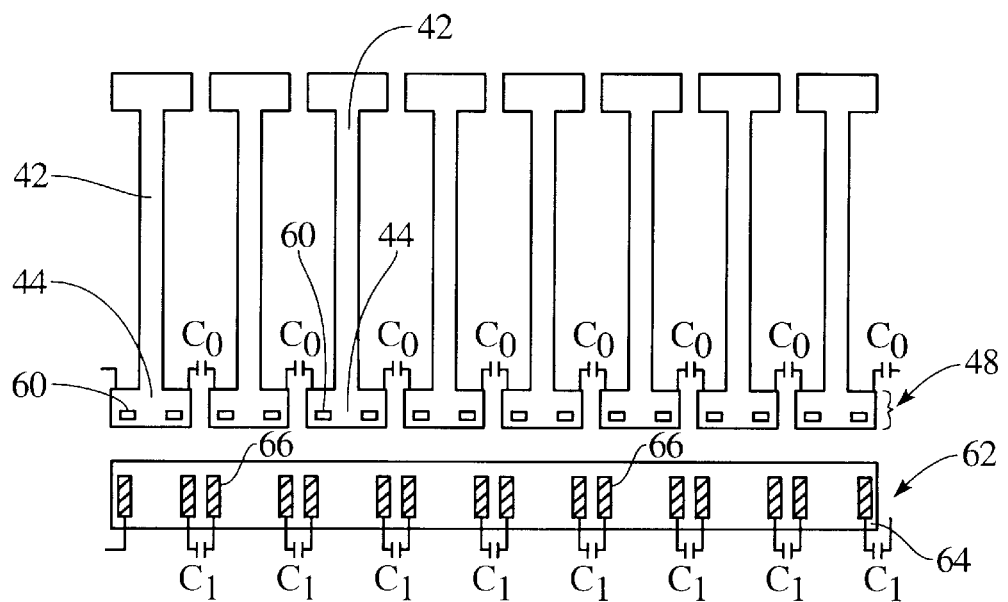
FIG. 6B is a partial view of the laid-out radio frequency coil of FIG. 3 including the adjustment end ring of FIG. 5 in a contact position for resonance at a lower frequency.

With continuing reference to FIG. 5, FIG. 3, and FIG. 6A, and further reference to FIG. 6B, when the adjustment end ring 62 is rotated, the metallic pads 66 on the adjustment end ring are brought into contact with the metal contacts 60, such that the capacitors $C_1$ are connected in parallel with capacitors $C_0$ of the end ring 48. In the contacting position, the additional capacitance decreases the resonant frequency of the RF coil. In other words, by proper selection of the value of capacitors $C_0$, the coil is made to resonate at a higher desired frequency. Further, by proper selection of capacitors $C_1$, which are combined in parallel with capacitors $C_0$, the coil is made to resonate at a lower desired frequency. A handle 72 allows the operator to easily rotate the adjustment end ring between the high and the low resonant frequency positions, thus allowing one to switch easily and quickly between the two resonant frequencies of the coil.

Figure 7:
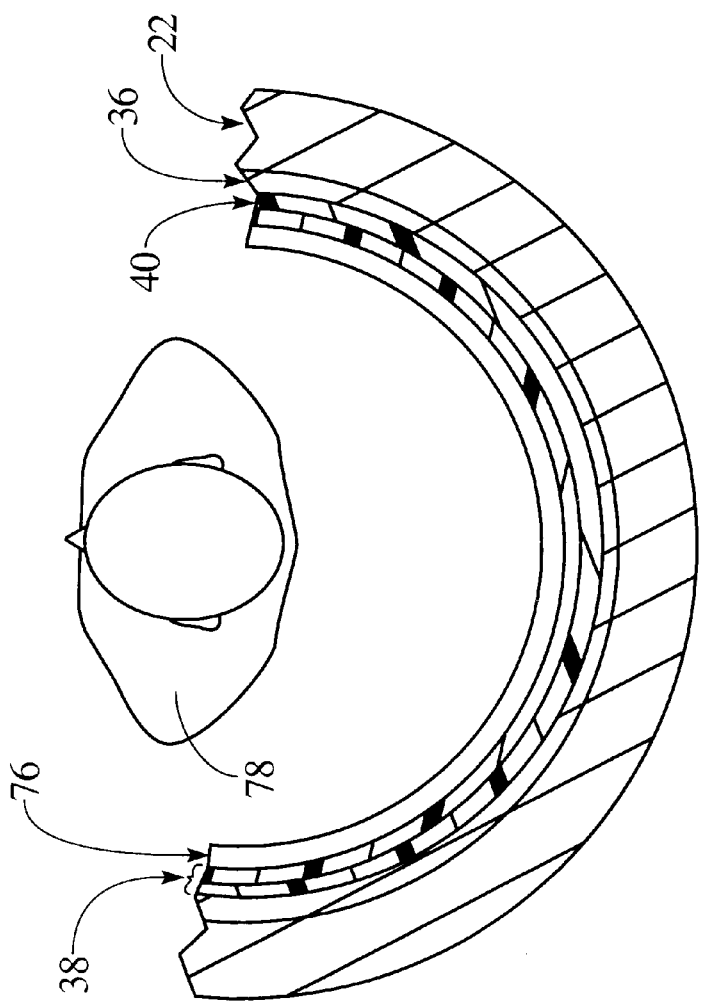
FIG. 7 is a partial cross-sectional view of the patient bore and surrounding radio frequency coil assembly, radio frequency shield, and gradient coil assembly.

With continuing reference to FIG. 3, the RF coil is capacitively coupled to two coaxial feed cables 74 at the two lower plus-minus 45 degree positions of the coil to obtain quadrature operation. In another embodiment, the RF coil is fed by inductive tuning loops instead of by capacitively coupled coaxial cables. With reference to FIG. 7, a thin fiberglass or plastic liner 76 is positioned on an interior diameter of the sheet 40 to cover the exposed conductor elements and electronic components, thereby protecting a patient 78.

With reference again to FIG. 1 and FIG. 3, in operation, a sequence control means 80 sends timing signals to a gradient coil control means 82 and a digital transmitter 84. The gradient coil control means 82 is connected with a series of current pulse generators 86 which, in turn, are connected with the primary and secondary gradient coil assemblies 22, 26. The transmitter 84 is connected with a quadrature transmit/receive divider 88 which is quadrature coupled with one of the end rings 48 via coaxial cables 74. The radio frequency transmitter generates radio frequency pulses for exciting and manipulating magnetic resonance of selected dipoles in the bore 12.

A radio frequency receiver 90, preferably a digital receiver, is connected with the end ring 48 through the quadrature transmit/receive divider 88 for receiving and demodulating magnetic resonance signals emanating from the examined portion of the subject. An image reconstruction means 92, such as an inverse two-dimensional Fourier transform reconstruction means, reconstructs the received magnetic resonance signals into an electronic representation that is stored in an image memory 94. A video processor 96 converts electronic images stored in the memory 94 into appropriate format for display on a video monitor 98.

Figure 8A:
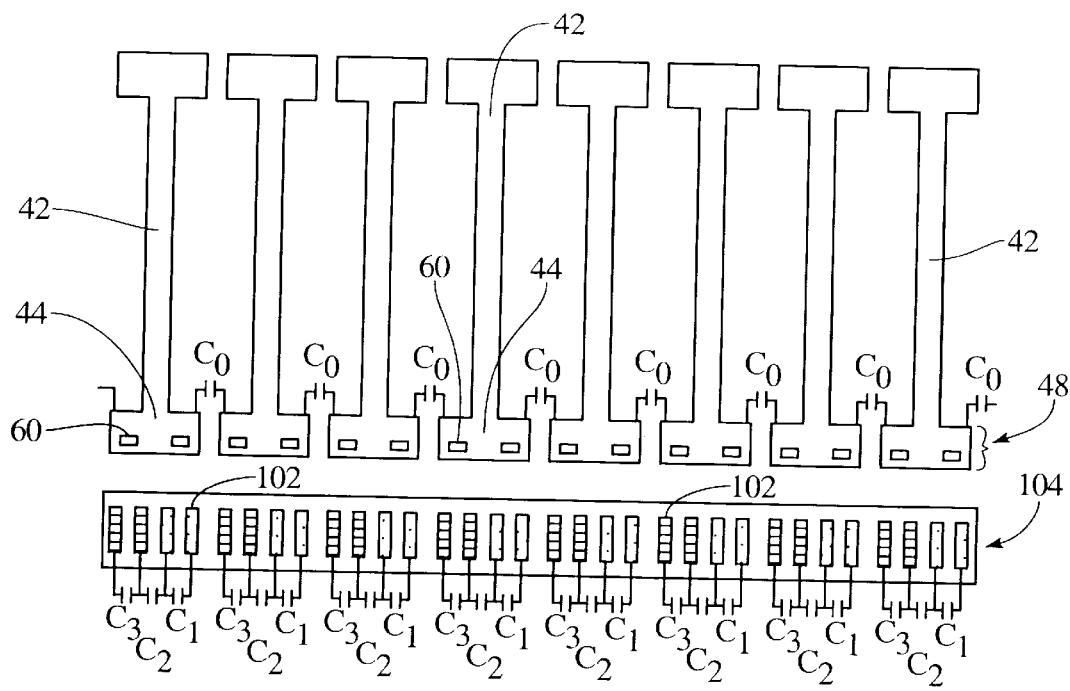
FIGS. 8A, B, C, and D are partial views of a laid-out alternate embodiment of a radio frequency coil assembly of the present invention including an adjustment end ring shown in a non-contact position (FIG. 8A), a first contact position (FIG. 8B), a second contact position (FIG. 8C), and a third contact position (FIG. 8D) for resonance at four different frequencies; and, FIG. 9 is an end view of another embodiment of the radio frequency coil in accordance with the present invention designed with coil elements and electrical components on an outer diameter of the coil.
Figure 8B:
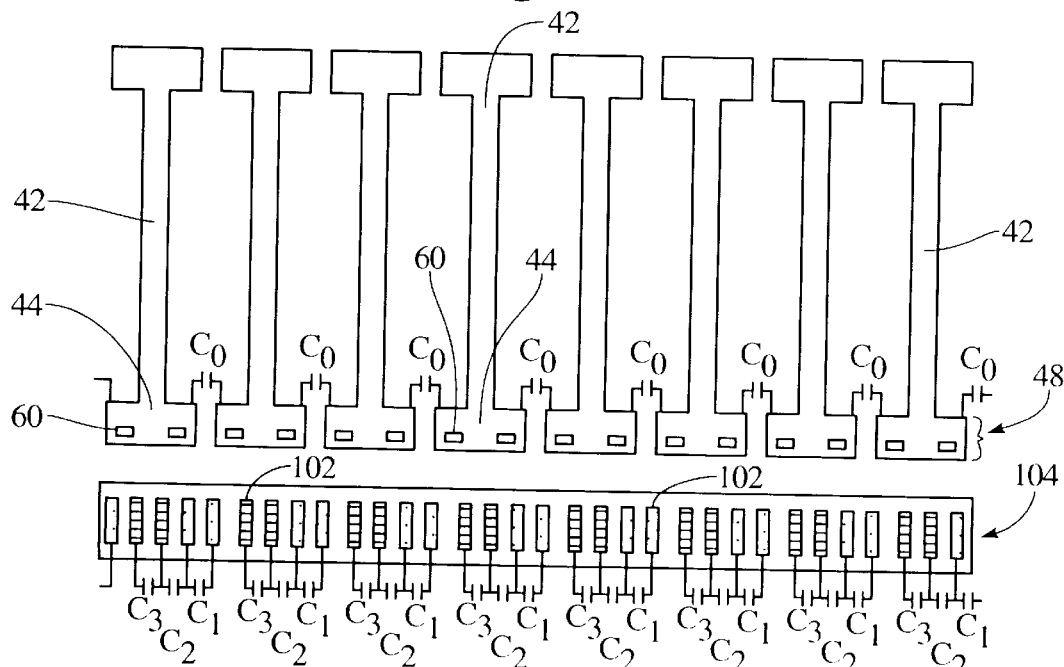
Figure 8C:
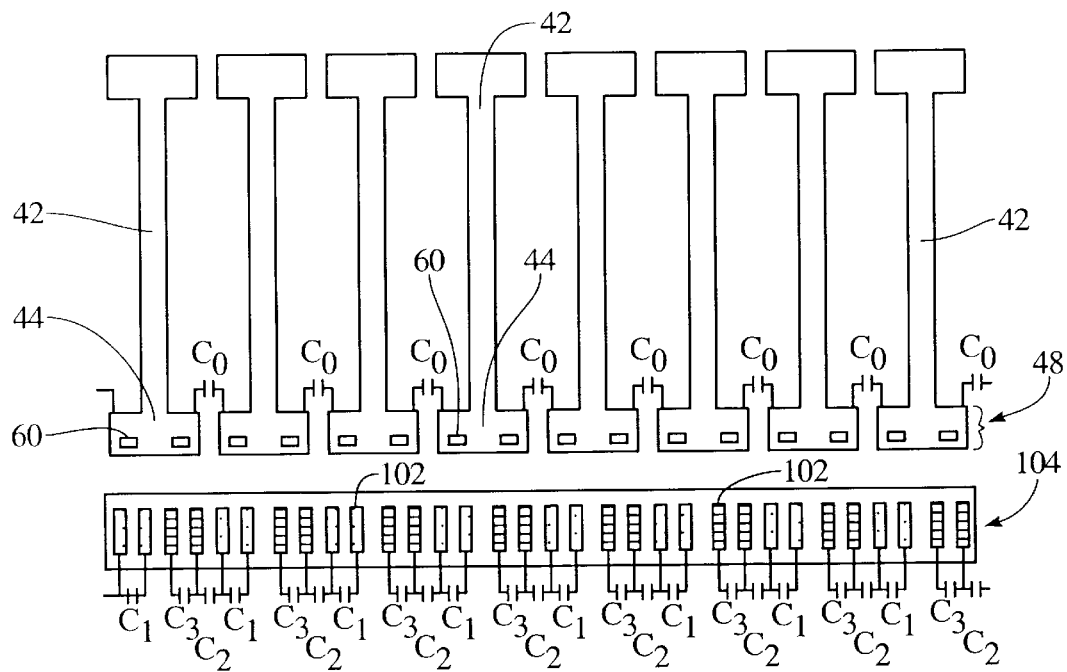
Figure 8D:
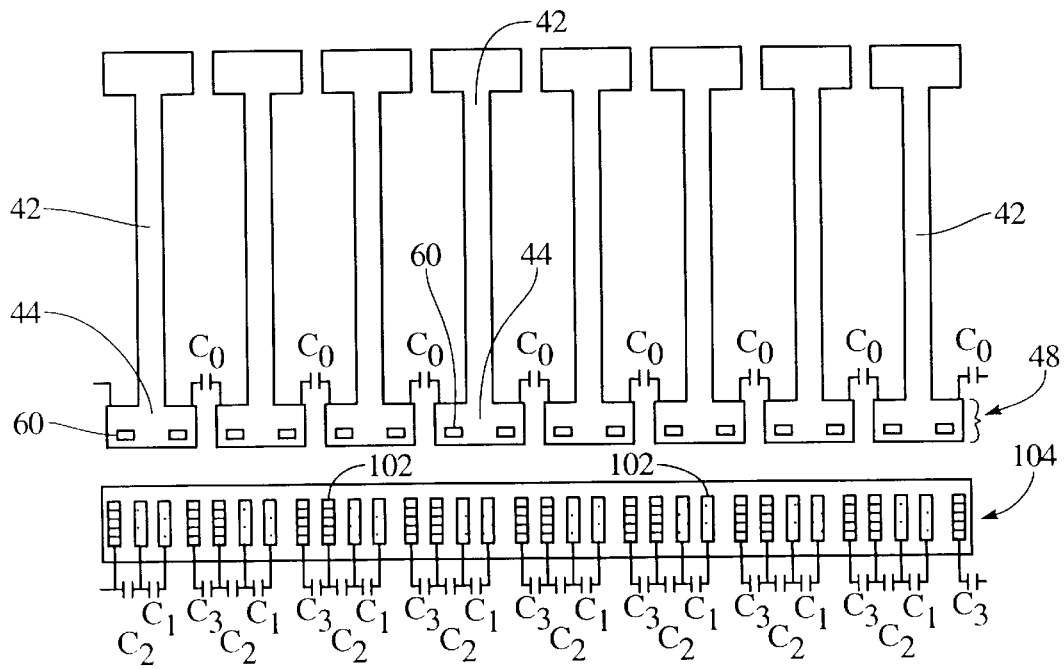

With reference to FIGS. 8A–D, another embodiment of the RF coil assembly 38 is resonant at more than two frequencies by providing additional sets of capacitors on an adjustment end ring 104. Three different sets of capacitors, $C_1$, $C_2$, and $C_3$, connect adjacent pairs of metal pads 102 on the adjustment end ring 104. The adjustment end ring is then rotated among four positions: non-contacting (FIG. 8A); contacting the set of capacitors $C_1$ (FIG. 8B); contacting the set of capacitors $C_2$ (FIG. 8C); and, contacting the set of capacitors $C_3$ (FIG. 8D). Each one of the positions creates a different resonant frequency in the RF coil.

Figure 9:
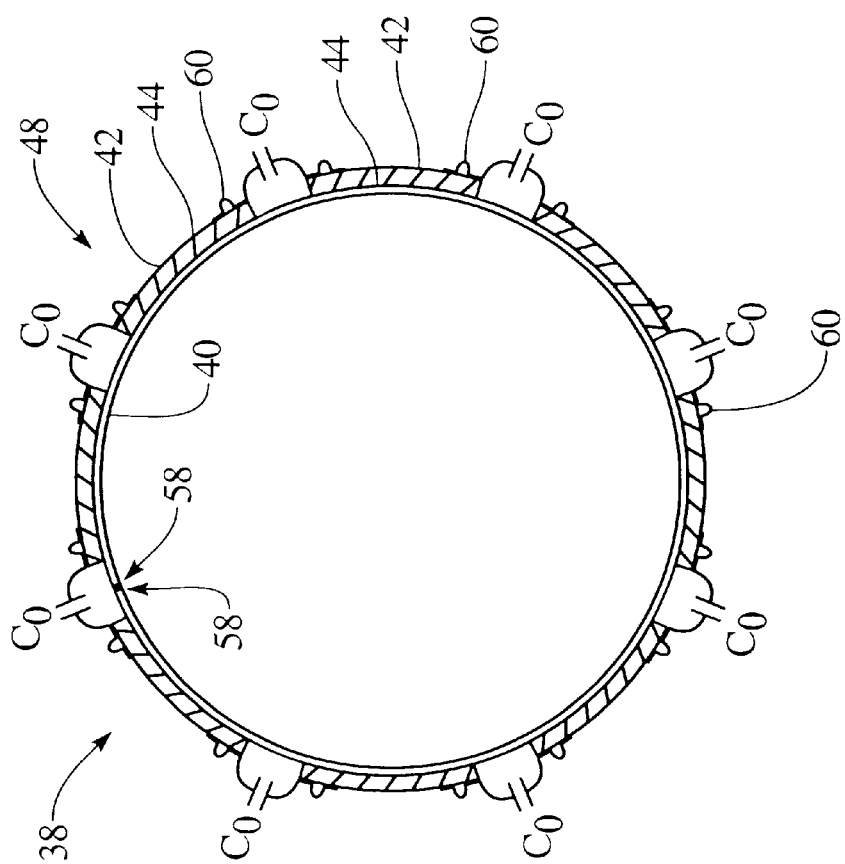

With reference to FIG. 9, in another embodiment of the RF coil assembly having 8 exterior conductor elements 42, capacitors $C_0$ and spring metal contacts 60 are connected on an outer diameter of the end ring 48. Accordingly, the adjustment end ring (not shown) fits over the outer diameter of the end ring. Such a configuration requires no protective cover sheet for the subject because the subject is not in danger of contacting exposed conductor elements or electronic components.

In yet another embodiment, the capacitors $C_0$ on the adjustment end ring are eliminated. Instead, the capacitance to lower the resonant frequency is provided simply by the capacitance of the ends of the conductor elements, the metal pads of the adjustment end ring, and the dielectric therebetween.

In still another alternate embodiment, two adjustment end rings are used, one at each axial end of the RF coil. This is done either to increase the number of frequencies at which the coil can be resonant or to balance the capacitance of the two coil end rings at each resonant frequency.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus which includes a toroidal magnet assembly for generating a temporally constant magnetic field through an examination region, the magnet assembly including a generally cylindrical member which defines a longitudinally extending bore around the examination region, a gradient coil assembly including a cylindrical dielectric former which supports a plurality of gradient coils mounted in the bore, and a volume radio frequency coil assembly, the radio frequency coil assembly comprising:

a plurality of longitudinally extending coil elements having element ends, the longitudinally extending coil elements formed by electrically conductive cladding disposed on a flat, flexible, resilient, non-conductive plastic sheet while the sheet is in a flat configuration, the flat plastic sheet being rolled into a cylinder and disposed concentrically within an interior diameter of the bore, resiliency of the plastic sheet biasing itself outward against and into conformity with the inner diameter of the bore, adjacent element ends of the coil elements being capacitively coupled to one another to form a bird-cage type coil.

2. The magnetic resonance apparatus as set forth in claim 1 further including a sequence control means for controlling the gradient coil assembly and the radio frequency coil assembly to generate gradient and radio frequency pulses of magnetic resonance imaging sequences.

3. A magnetic resonance apparatus which includes a toroidal magnet assembly for generating a temporally constant magnetic field through an examination region, the magnet assembly including a generally cylindrical member which defines a longitudinally extending bore around the examination region, a gradient coil assembly including a cylindrical dielectric former which supports a plurality of gradient coils mounted in the bore, and a radio frequency coil assembly, the radio frequency coil assembly comprising:

a plurality of equally-spaced longitudinally extending conductor elements having element ends, the longitudinally extending conductor elements disposed on a thin, flexible, non-conductive plastic sheet; and, a capacitive jumper connector for capacitively connecting outermost element ends of the plastic sheet.

4. The magnetic resonance apparatus as set forth in claim 3 wherein the capacitive jumper connector includes an electrical pin which is received in a matching bore in one of the outermost element ends of the plastic sheet, the pin element permitting electrical communication at radio frequencies between the outermost element ends that are connected by the jumper connector.

5. A magnetic resonance apparatus which includes a magnet assembly for generating a temporally constant magnetic field through an examination region, a gradient coil assembly which supports a plurality of gradient coils adjacent the examination region, and a volume radio frequency coil assembly, the radio frequency coil assembly comprising:

a plurality of longitudinally extending conductor elements having element ends, the longitudinally extending conductor elements disposed on at least one flat, flexible, non-conductive plastic sheet, the flat plastic sheet being rolled into a cylinder and disposed concentrically around the examination region;

metal contacts electrically connected to the element ends; and, an adjustment end ring for adjusting the resonant frequency of the radio frequency coil, the adjustment end ring being disposed over the metal contacts, the adjustment end ring having separated metal pads disposed on a non-conducting ring substrate, the diameter of the adjustment end ring preselected to permit resilient contact with the metal contacts, the adjustment end ring being rotatable between a non-contact position, in which the metal pads are not in electrical contact with the element ends, and a contact position, in which the metal pads are in electrical contact with the element ends such that capacitance between elements is increased.

6. The magnetic resonance apparatus as set forth in claim 5 wherein capacitors are connected between adjacent metal pads of the adjustment end ring to increase the resultant capacitance between elements in a contact position.

7. The magnetic resonance apparatus as set forth in claim 5 further including a handle attached to the adjustment end ring to permit an operator to selectively, mechanically rotate the adjustment end ring between a contact and a non-contact position to adjust the resonant frequency of the radio frequency coil assembly.

8. The magnetic resonance apparatus as set forth in claim 5 further including a spring contact associated with one of the metal contacts and the metal pads.

9. A magnetic resonance apparatus which includes a magnet assembly for generating a temporally constant magnetic field through an examination region, the magnet assembly including a generally cylindrical member which defines a cylindrical bore around the examination region, a gradient coil assembly including a dielectric former which supports a plurality of gradient coils in the bore, and a radio frequency coil assembly, the radio frequency coil assembly comprising:

a plurality of longitudinally extending coil elements having element ends, the longitudinally extending coil elements disposed on a flexible plastic sheet, the plastic sheet being rolled into a cylinder and disposed concentrically within an interior diameter of the bore;

a plurality of metal contacts electrically connected to the element ends; and an adjustment end ring for adjusting the resonant frequency of the radio frequency coil, the adjustment end ring being disposed over the metal contacts, the adjustment end ring having separated metal pads disposed on a non-conducting ring substrate, a first set of the separated metal pads capacitively connected with capacitance $C_1$ and a second set of the separated metal pads capacitively connected with capacitance $C_2$, the diameter of the adjustment end ring being preselected such that it is resiliently biased against the metal contacts, the adjustment end ring being rotatable among (i) a non-contact position, in which the metal pads are not in contact with the metal contacts, (ii) a first position, in which the first set of metal pads are in electrical communication with the metal contacts which introduces capacitance $C_1$ between elements, and a second position in which the second set of metal pads are in electrical communication with the metal contacts which introduces capacitance $C_2$ between elements.

10. The magnetic resonance apparatus as set forth in claim 9 further including a handle attached to the adjustment end ring to permit an operator to selectively, mechanically rotate the adjustment end ring among the first and second positions, and the non-contact position.

11. A magnetic resonance apparatus which includes a magnet assembly for generating a temporally constant magnetic field through an examination region, a generally cylindrical member which defines a cylindrical bore around the examination region, a gradient coil assembly including a cylindrical dielectric former which supports a plurality of gradient coils mounted in the bore, and a volume radio frequency coil assembly, the radio frequency coil assembly comprising:

a plurality of longitudinally extending conductor elements having element ends, which plurality of elements is a multiple of four such that quadrature of the radio frequency coil is obtained, the longitudinally extending conductor elements being disposed on a thin, flexible, non-conductive sheet which is rolled into a cylinder and disposed in the cylindrical bore.

12. A magnetic resonance apparatus which includes a magnet assembly for generating a temporally constant magnetic field through an examination region, a generally cylindrical member which defines a longitudinally extending bore around the examination region, a gradient coil assembly including a dielectric former which supports a plurality of gradient coils mounted in the bore, and a radio frequency coil assembly, the radio frequency coil assembly comprising:

a flat, flexible, non-conductive plastic sheet which is flexed into conformity with a cylindrical inner surface of the bore;

a plurality of longitudinally extending coil elements disposed on an interior diameter of the sheet when the sheet is flexed and inserted into the cylindrical bore; and, a non-conducting liner disposed on the interior diameter of the sheet to prevent a subject received in the examination region from contacting electrical components of the radio frequency coil assembly.

13. A magnetic resonance apparatus comprising:

a magnetic assembly for generating a magnetic field through an examination region;

a radio frequency coil assembly which performs at least one of (1) selectively transmitting radio frequency signals into the examination region to induce and manipulate resonance of first, higher gyromagnetic ratio dipoles and second, lower gyromagnetic ratio dipoles disposed in the examination region, and (2) selectively receiving first resonance frequency signals from the first dipoles and second resonance frequency signals from the second dipoles, and a processor for processing the received magnetic resonance signals, the radio frequency coil including:

a plurality of parallel coil elements which define a cylindrical region, the coil elements having first metal contacts;

an end ring providing a first capacitance $C_0$ between adjacent coil elements such that the radio frequency coil resonates at the frequency of first, higher gyromagnetic ratio dipoles; and, an adjustment end ring for adjusting the resonant frequency of the radio frequency coil, the adjustment end ring having separated second metal contacts disposed on a non-conducting ring substrate, pairs of the separated second metal contacts capacitively connected with a second capacitance $C_1$, a diameter of the adjustment end ring being preselected to permit resilient contact of the first metal contacts with the second metal contacts, the adjustment end ring being rotatable between a non-contact position, in which the second metal contacts are not in contact with the first metal contacts, and a first contact position, in which the second metal contacts are in contact with the first metal contacts such that second capacitances C, are introduced between elements and in parallel with first capacitances Co such that the radio frequency coil is resonant at the frequency of the second, lower gyromagnetic ratio dipoles.

14. The magnetic resonance apparatus as set forth in claim 13 wherein the plurality of parallel coil elements are disposed on a flexible, non-conductive plastic sheet.

15. The magnetic resonance apparatus as set forth in claim 14 wherein the coil elements are disposed on an interior diameter of the sheet, the radio frequency coil assembly further including a non-conducting liner disposed on an interior diameter of the sheet to prevent a subject from contacting electrical components of the radio frequency coil assembly.

16. The magnetic resonance apparatus as set forth in claim 14 further including a capacitive jumper connector to connect outermost elements on the conductor sheet.

17. The magnetic resonance apparatus as set forth in claim 13 further including a handle attached to the adjustment end ring to permit an operator to selectively, mechanically rotate the adjustment end ring between the contact and the non-contact position.

18. The magnetic resonance apparatus as set forth in claim 13 wherein the number of elements is a multiple of four such that quadrature of the radio frequency coil assembly is obtained.

19. The magnetic resonance apparatus as set forth in claim 13 further including a spring contact associated with one of the first and the second contacts.

20. A method of magnetic resonance imaging with a magnetic resonance imaging apparatus which includes a generally toroidal magnetic assembly for generating a temporally constant magnetic field through an examination region and for selectively generating magnetic field gradients across the temporally constant magnetic field in the examination region, the magnet assembly including a cylindrical former extending around a patient receiving bore and a radio frequency coil assembly including a plurality of longitudinally extending conductor elements having capacitively coupled element ends, the longitudinally extending conductor elements formed by electrically conductive cladding disposed on a resilient, flexible, non-conductive, flat, plastic sheet, the resilient plastic sheet capable of being flexed, inserted in, and remaining concentric with an interior diameter of the bore, adjacent element ends of such conductor elements being capacitively connected to one another to form a bird-cage type coil, the method comprising:

rolling the plastic sheet into a cylinder of smaller diameter than the bore;

selectively inserting the rolled plastic sheet into the bore and allowing the sheet to expand resiliently against the bore such that outermost elements thereon are brought adjacent one another extending longitudinally alone an inner diameter of the bore;

attaching capacitive jumpers across abutting ends of the plastic sheet between element ends of the outermost elements on the plastic sheet to complete an end ring;

attaching a two-port electrical feed to the end ring; and inserting a patient into the bore and performing a magnetic resonance imaging sequence.

\* \* \* \* \*